(12) United States Patent
Bucksch et al.

(10) Patent No.: US 6,750,670 B2
(45) Date of Patent: Jun. 15, 2004

(54) INTEGRATED TEST CIRCUIT

(75) Inventors: Thorsten Bucksch, München (DE); Ralf Schneider, München (DE)

(73) Assignee: Infineon Technologies AG, Müenchen (DE)

( * ) Notice: Subject to any disclaimer, the term of this patent is extended or adjusted under 35 U.S.C. 154(b) by 0 days.

(21) Appl. No.: 10/317,933

(22) Filed: Dec. 12, 2002

(65) Prior Publication Data

US 2003/0107392 A1 Jun. 12, 2003

(51) Int. Cl.[7] .............................................. G01R 31/02
(52) U.S. Cl. ...................................... 324/763; 327/277
(58) Field of Search .............................. 324/763, 617, 324/76.77, 76.82; 368/117; 327/149, 158, 276, 277, 270, 284, 285

(56) References Cited

U.S. PATENT DOCUMENTS 6,380,782 B2 * 4/2002 Buck ........................... 327/233
6,400,200 B2 * 6/2002 Sasaki ......................... 327/244

FOREIGN PATENT DOCUMENTS

DE          100 06 236 A1     9/2001

* cited by examiner

Primary Examiner—David A. Zarneke
Assistant Examiner—Trung Q Nguyen
(74) Attorney, Agent, or Firm—Laurence A. Greenberg; Werner H. Stemer; Gregory L. Mayback

(57) ABSTRACT

An integrated test circuit, as part of an integrated circuit, includes phase-shifted test signals fed through inputs A and B. These test signals are conducted through a plurality of cascaded delay elements, the advancing of the first test signal through the delay elements being held and evaluated by the second test signal.

18 Claims, 1 Drawing Sheet

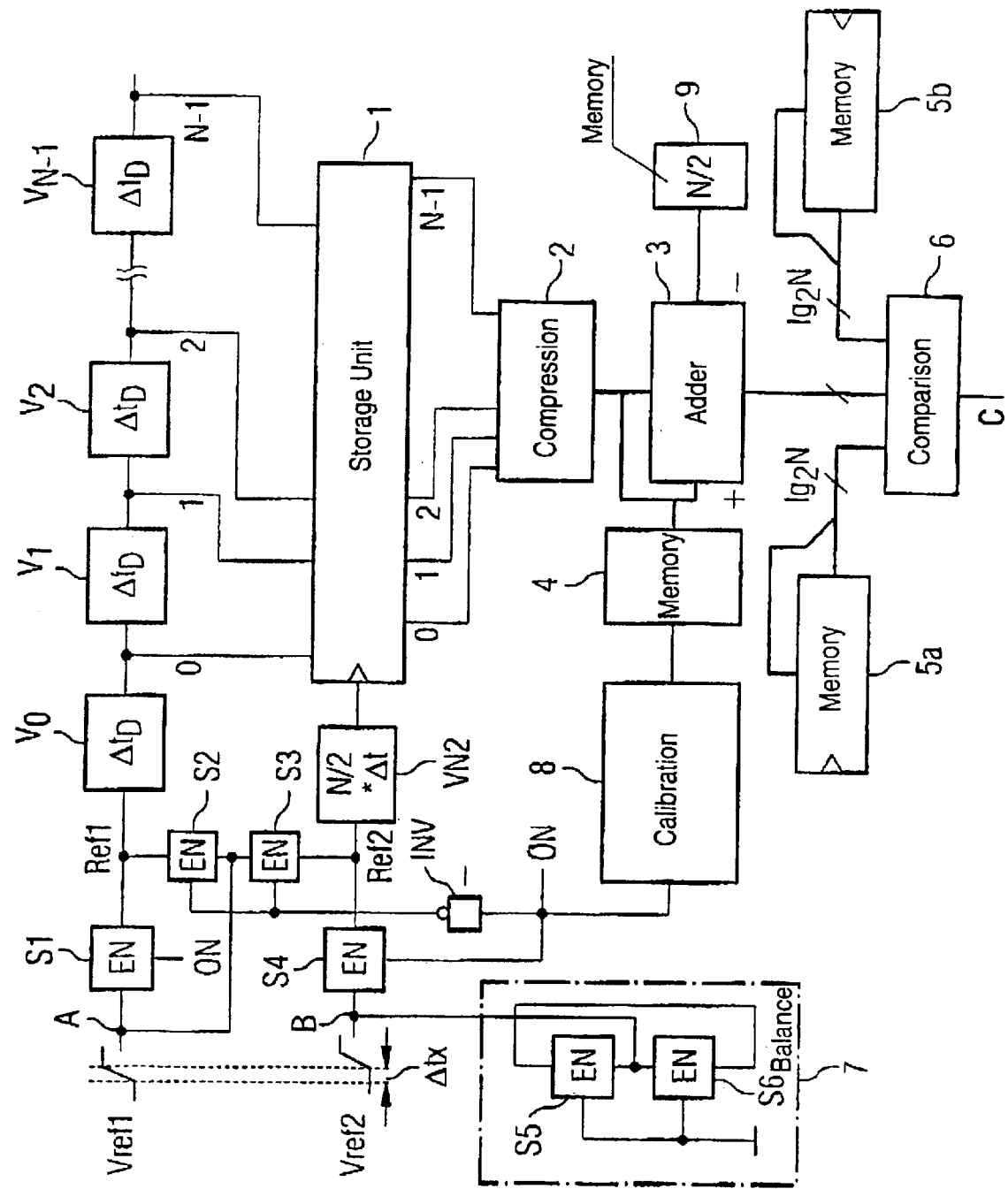

INTEGRATED TEST CIRCUIT

BACKGROUND OF THE INVENTION

Field of the Invention

The invention relates to an integrated circuit with an integrated test circuit.

Integrated circuits are nowadays produced in inconceivably high numbers. As a result of the complex production technology, the need for minimum production costs and the requirements made of optimized technological properties, during production it is customary for individual elements to arise that do not correspond to the specification and have to be separated out by sorting. These integrated circuits are nowadays produced simultaneously on so-called wafers, a plurality of wafers being processed simultaneously for utilization of the costly production devices.

To prevent defective integrated circuits from being processed further, the integrated circuits are usually tested as early as on the wafer.

Complex test equipment is required for such a test, which equipment, in the case of integrated circuits having new technology or a changed behavior, has to be adapted to the integrated circuits.

The adaptation requires a high capital expenditure on the test devices, which readily stands in disproportion to the gain through determining defective integrated circuits in good time. The outlay for the test device rises particularly in the case of dynamic measurements because the switching times or signal propagation times to be measured require high-frequency measuring devices.

SUMMARY OF THE INVENTION

It is accordingly an object of the invention to provide an integrated test circuit that overcomes the hereinaforementioned disadvantages of the heretofore-known devices of this general type and that can be tested precisely with minimum outlay.

With the foregoing and other objects in view, there is provided, in accordance with the invention, an integrated test circuit, including a first input for receiving a first test signal, a second input for receiving a second test signal phase-shifted by a predetermined time with respect to the first test signal, series-connected delay elements connected to the first input and receiving the first test signal, each of the delay elements generating an output signal, and an evaluation circuit connected to the delay elements and receiving the output signals of the delay elements as an information carrier, and the second input and receiving the second test signal as a control signal.

The fact that the integrated circuit has a test circuit moves the problem of the measurement outlay into the individually integrated circuit. Because the latter is produced in the same technology, the behavior of the integrated test circuit can be used to deduce the behavior of the entire integrated circuit. If the requirements of the test circuit are not sufficient, then the integrated circuit, as such, is not sufficient overall. Consequently, only two test signals need be fed to the integrated circuit, which test signals must have a predetermined phase shift with respect to one another. The integrated circuit or its integrated test circuit outputs its test result at the output according to a "YES"/"NO" response.

In accordance with another feature of the invention, the evaluation circuit has a storage unit to which the output signals of the delay elements are fed in parallel.

In accordance with a further feature of the invention, the evaluation circuit has a storage unit connected to each of the delay elements and the storage unit receives the output signals of the delay elements in parallel.

By virtue of the fact that a storage unit is provided in the evaluation circuit, to which storage unit the output signals of the first delay elements are fed in parallel, the dynamic behavior of the integrated circuit, as such, can, thereby, be ascertained and evaluated as a snapshot. This is facilitated, in particular, by the fact that the storage device is controlled by the second test signal. Such control is advantageously accomplished by feeding the second test signal through a second delay element. If the second delay element effects a delay that is N/2 times that of the first delay elements, the evaluation is simplified.

In accordance with an added feature of the invention, the second test signal is fed as a control signal to the storage unit.

In accordance with an additional feature of the invention, there is provided a second delay element connected to the second input and to the storage unit, the second test signal being fed as a control signal to the storage unit through the second delay element.

In accordance with yet another feature of the invention, the storage unit contains content and a comparison device is connected to the storage unit and receives the content for comparison with at least one of an upper threshold value and a lower threshold value.

By providing a lower and upper limit or threshold value memory, the comparison device can be used to ascertain whether or not the result of the test measurement lies within a predetermined window.

In accordance with yet a further feature of the invention, the evaluation circuit has a calibration device. The provision of a calibration device means that the integrated test circuit as such is adjustable with regard to production fluctuations.

In accordance with yet an added feature of the invention, there is provided an input balance device.

In accordance with yet an additional feature of the invention, there is provided an input balance device connected to at least one of the first input and the second input for compensating for input-side loading. Providing the input balance device means that the accuracy of the test measurement can be increased.

With the objects of the invention in view, in an integrated circuit providing first and second test signals phase-shifted by a predetermined time with respect to one another, there is also provided an integrated test circuit including a first input for receiving the first test signal, a second input for receiving the second test signal, series-connected delay elements connected to the first input and receiving the first test signal, each of the delay elements generating an output signal, and an evaluation circuit connected to the delay elements and receiving the output signals of the delay elements as an information carrier, and the second input and receiving the second test signal as a control signal.

Other features that are considered as characteristic for the invention are set forth in the appended claims.

Although the invention is illustrated and described herein as embodied in an integrated test circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

The FIGURE is a block circuit diagram of an integrated test circuit according to the invention to be part of an integrated circuit on a so-called semiconductor chip.

DESCRIPTION OF THE PREFERRED EMBODIMENTS

Referring now to the single FIGURE of the drawing, it is seen that a first input signal Vref1 and a second input signal Vref2 are fed through the two input terminals A and B. The two input signals are phase-shifted with respect to one another by a time $\Delta tx$, the direction of the phase shift being independent of one another, i.e., Vref1 can lead or lag behind Vref2.

The first test signal Vref1 is fed to a plurality of first delay elements V0, V1, V2, . . . VN−1 through a switch S1. Each of the delay elements delays the test signal Vref1 by the delay time $\Delta tD$. The first delay elements V0 to Vn−1 are variable. The output signals of each first delay element are fed as input signal to the next delay element, i.e., the first delay element V0 feeds its output signal as input signal to the delay element V1, etc. At the same time, the respective output signals are tapped off and fed in parallel to a storage unit, which is, preferably, a so-called D-type latch 1 in the present exemplary embodiment.

The first test signal Vref1 represents a transition from a first level to a second level, i.e., for a logic circuit or digital circuit, which represents the transition from 0 to 1 or vice-versa. The second test signal Vref2, which is manifested in the same way as the first test signal Vref1, is fed through the second test input terminal B, and is phase-shifted with respect to the first test signal Vref1 by a time $\Delta tx$. It is irrelevant in this case which of the two test signals leads or lags. The second test signal Vref2 is fed as control signal to the D-type latch 1 through the second delay element VN2. In such a case, the second delay element effects a delay time that is N/2 times that of the delay time of the first delay elements.

This means that if the first and second test signals were fed to the respective inputs without a phase shift, D-type latch 1 would detect precisely the instant at which the first test signal Vref1 had traversed half of the first delay elements. Depending on whether the phase shift $\Delta tx$ between the first test signal Vref1 and the second test signal Vref2 is positive or negative, the image in the D-type latch 1 of the first test signal that has advanced through the first delay elements is offset further or less far than half of the delay elements. Consequently, the D-type latch 1 holds a pattern of ones and zeros that is characterized by the delay time $\Delta tx$ and the accuracy of the technology.

The pattern of ones and zeros that is stored and is present at the output of the D-type latch 1 can be compressed because, by the circuit configuration, a specific number of serial positions are always occupied by 1, and the rest by 0. More precisely, it is always the case that, firstly, the positions are occupied by 1 and the remaining positions by 0, or vice-versa, depending on whether the signal transition from 0 to 1 or from 1 to 0 is held. In the compression circuit 2, which is configured as a log decoder, the output pattern of the D-type latch 1 can be compressed as a vector with log2N places. The, thus, compressed output signal of the log decoder 2 is fed to an adder 3, in which, on one hand, a zero offset stored in a zero value memory referred to as zero latch 4 hereinafter, is added to the compressed pattern and a balance factor stored in a read-only memory 9, which balance factor is N/2 in the exemplary embodiment, is subtracted. The result is fed to a comparison device 6, which compares the result, on one hand, with a lower threshold value stored in a lower threshold value memory 5a and, on the other hand, with an upper threshold value stored in an upper threshold value memory 5b. If the result output by the adder 3 is present within the upper and lower threshold values, then the comparison device outputs an output signal that the measurement has been carried out satisfactorily. This means that a functional circuit is present. Otherwise, a signal that does not correspond thereto is output if a functional circuit is not present.

The circuit has, thus, been explained, first of all, in principle. To increase the accuracy in adaptation to production tolerances, the circuit has to be calibrated. Such calibration is done by a so-called time expansion function, which is described below.

The calibration has to be set individually for each step, and the parallel measurability must not be impaired in this case. A corresponding procedure is explained below on the basis of the FIGURE. For the expansion function, during the calibration, instead of the delay $\Delta tD$, k times this value is set in the first delay elements. The lower threshold value is determined in a first step. In such a case, K times the minimum valid shift is set for the phase shift between the first and second test signals. As described above, the first test signal Vref1 traverses the first delay chain and is stored by the second test signal Vref2 in the D-type latch 1. The log decoder 2 compresses the value and stores the decoded value in the lower threshold value memory 5a, the balance factor from the read-only memory 9, again, being taken into account.

The same procedure takes place in the second step, k times the maximum permissible shift between the first test signal Vref1 and the second test signal Vref2 being applied. The value is correspondingly stored in the upper threshold value memory 5b.

Finally, the zero offset is determined. For such a purpose, the time expansion function is, in turn, deactivated, meaning that all the delay elements now have the value $\Delta tD$ again. The automatic calibration unit 8 generates a control signal to isolate the second test signal Vref2 from the input. For such a purpose, a signal corresponding to the "OFF" state is present at the fourth switch S4. At the same time, this signal is fed through an inverter INV as inverted signal to the second switch S2 and the third switch S3, which are connected in series between the first delay element of the first delay elements V0 to VN−1 and the second delay element VN2. The first test signal Vref1 is simultaneously fed to the second and third switches that, in accordance with the signal fed through the inverter INV, in the switched-on state, simultaneously feed the first test signal Vref1 to the first delay elements and the second delay element. At the same time, the first switch S1 is switched off. In the case of the zero offset determination thus set, precisely the state that has already been described earlier is effected, namely, that there is no phase shift between the first and second test signals. In other words, ideally it should be possible to discern the transition from "0" to "1" or vice-versa after half of the places in the D-type latch 1. The deviation that can be ascertained therefrom is stored as zero offset in zero latch 4 for the actual test measurement.

Finally, a balance element 7 is provided to compensate for the input-side loading by the switches S2, S3. For such a purpose, the balance element 7, correspondingly, has a fifth switch S5 and a six switch S6, which generate a corresponding loading of the second input B in the normal test case.

In addition to the specific devices illustrated and described in the exemplary embodiment, variations that lead to the same result while maintaining the measurement or test system are also conceivable.

We claim:

1. An integrated test circuit, comprising:
   a first input for receiving a first test signal;
   a second input for receiving a second test signal phase-shifted by a predetermined time with respect to the first test signal;
   series-connected delay elements connected to said first input and receiving the first test signal, each of said delay elements generating an output signal; and
   an evaluation circuit connected to:
      said delay elements and receiving said output signals of said delay elements as an information carrier; and
      said second input and receiving the second test signal as a control signal.

2. The integrated circuit according to claim 1, wherein said evaluation circuit has a storage unit to which said output signals of said delay elements are fed in parallel.

3. The integrated circuit according to claim 2, wherein the second test signal is fed as a control signal to said storage unit.

4. The integrated circuit according to claim 3, including a second delay element connected to said second input and to said storage unit, the second test signal being fed as a control signal to said storage unit through said second delay element.

5. The integrated circuit according to claim 4, wherein:
   said storage unit contains content; and
   a comparison device is connected to said storage unit and receives said content for comparison with at least one of an upper threshold value and a lower threshold value.

6. The integrated circuit according to claim 1, wherein said evaluation circuit has a calibration device.

7. The integrated circuit according to claim 6, including an input balance device.

8. The integrated circuit according to claim 1, wherein said evaluation circuit has a calibration device connected between said evaluation circuit and said delay elements.

9. The integrated circuit according to claim 8, including an input balance device connected to at least one of said first input and said second input for compensating for input-side loading.

10. The integrated circuit according to claim 1, wherein said evaluation circuit has a storage unit connected to each of said delay elements and said storage unit receives said output signals of said delay elements in parallel.

11. The integrated circuit according to claim 10, wherein said storage unit is connected to said second input and receives the second test signal as a control signal.

12. The integrated circuit according to claim 11, including a second delay element connected to said second input and to said storage unit, said second delay element feeding the second test signal as a control signal to said storage unit.

13. The integrated circuit according to claim 12, wherein:
   said storage unit contains content; and
   a comparison device is connected to said storage unit and receives said content for comparison with at least one of an upper threshold value and a lower threshold value.

14. The integrated circuit according to claim 1, wherein said evaluation circuit has a calibration device.

15. The integrated circuit according to claim 14, including an input balance device.

16. The integrated circuit according to claim 1, wherein said evaluation circuit has a calibration device connected between said evaluation circuit and said delay elements.

17. The integrated circuit according to claim 16, including an input balance device connected to at least one of said first input and said second input for compensating for input-side loading.

18. In an integrated circuit providing first and second test signals phase-shifted by a predetermined time with respect to one another, an integrated test circuit comprising:
   a first input for receiving the first test signal;
   a second input for receiving the second test signal;
   series-connected delay elements connected to said first input and receiving the first test signal, each of said delay an output signal; and
   an evaluation circuit connected to:
      said delay elements and receiving said output signals of said delay elements as an information carrier; and
      said second input and receiving the second test signal as a control panel.

* * * * *

UNITED STATES PATENT AND TRADEMARK OFFICE
CERTIFICATE OF CORRECTION

PATENT NO. : 6,750,670 B2
DATED : June 15. 2004
INVENTOR(S) : Thorsten Bucksch et al.

It is certified that error appears in the above-identified patent and that said Letters Patent is hereby corrected as shown below:

<u>Title page,</u>
Item [30], Foreign Application Priority Data, should read as follows:
-- Dec. 12, 2001   (DE)   ......... 101 61 049 --

Signed and Sealed this

Sixteenth Day of November, 2004

JON W. DUDAS
*Director of the United States Patent and Trademark Office*